(12) United States Patent
Gers

(10) Patent No.: US 9,237,650 B2
(45) Date of Patent: Jan. 12, 2016

(54) FORMING OF AN ELECTRIC CONNECTION OF THE VIA TYPE

(71) Applicant: COMMISSARIAT A L'ENERGIE ATOMIQUE ET AUX ENE ALT, Paris (FR)

(72) Inventor: Roland Gers, Grenoble (FR)

(73) Assignee: COMMISSARIAT A L'ENERGIE ATOMIQUE ET AUX ENE ALTERNATIVES, Paris (FR)

( * ) Notice: Subject to any disclaimer, the term of this patent is extended or adjusted under 35 U.S.C. 154(b) by 0 days.

(21) Appl. No.: 14/365,535

(22) PCT Filed: Dec. 13, 2012

(86) PCT No.: PCT/EP2012/075364
§ 371 (c)(1),
(2) Date: Jun. 13, 2014

(87) PCT Pub. No.: WO2013/087760
PCT Pub. Date: Jun. 20, 2013

(65) Prior Publication Data
US 2014/0346680 A1    Nov. 27, 2014

(30) Foreign Application Priority Data
Dec. 14, 2011  (FR) ................................ 11 61643

(51) Int. Cl.
*H05K 1/11* (2006.01)
*H01L 21/768* (2006.01)
(Continued)

(52) U.S. Cl.
CPC .......... *H05K 1/115* (2013.01); *H01L 21/76898* (2013.01); *H01L 23/481* (2013.01);
(Continued)

(58) Field of Classification Search
CPC ....... H01L 21/60; H01L 21/311; H01L 23/12; H01L 23/48; H01L 23/498; H01L 23/49827; H01L 25/04; H05K 1/11
See application file for complete search history.

(56) References Cited

U.S. PATENT DOCUMENTS

| | | |
|---|---|---|
| 2010/0164117 A1 | 7/2010 | Chen |
| 2010/0289140 A1 | 11/2010 | Sunohara et al. |
| 2011/0133335 A1 | 6/2011 | Chen |

FOREIGN PATENT DOCUMENTS

| | | |
|---|---|---|
| DE | 102 05 026 | 5/2003 |
| EP | 2 075 828 | 7/2009 |

(Continued)

OTHER PUBLICATIONS

Sunohara, M. et al., "Development of Silicon Module with TSVs and Global Wiring (L/S=0.8/0.8μm)", Electronic Components and Technology Conference, pp. 25-31, (2009).
(Continued)

*Primary Examiner* — Fernando L Toledo
*Assistant Examiner* — Lawrence-Linh T Nguyen
(74) *Attorney, Agent, or Firm* — Oblon, McClelland, Maier & Neustadt, L.L.P.

(57) ABSTRACT

A method and an electronic component including: a substrate including at least a hole at least partially going through a thickness of the substrate; an electrically conducting element positioned in the hole and configured to form an electric connection through the hole, wherein the electrically conducting element includes an electrically conducting and self-supporting pillar with a height oriented according to the thickness of the substrate; and a space between at least a part of the wall of the hole and a part of a peripheral wall of the pillar.

30 Claims, 9 Drawing Sheets

(51) Int. Cl.
*H01L 23/48* (2006.01)
*H01L 25/065* (2006.01)
*H01L 25/00* (2006.01)
*H01L 23/00* (2006.01)
*H01L 23/498* (2006.01)

(52) U.S. Cl.
CPC .......... *H01L23/49827* (2013.01); *H01L 24/13* (2013.01); *H01L 24/16* (2013.01); *H01L 24/81* (2013.01); *H01L 25/0657* (2013.01); *H01L 25/50* (2013.01); *H01L 2224/0401* (2013.01); *H01L 2224/0557* (2013.01); *H01L 2224/05571* (2013.01); *H01L 2224/06181* (2013.01); *H01L 2224/11462* (2013.01); *H01L 2224/13009* (2013.01); *H01L 2224/13021* (2013.01); *H01L 2224/13025* (2013.01); *H01L 2224/13147* (2013.01); *H01L 2224/1403* (2013.01); *H01L 2224/16146* (2013.01); *H01L 2224/16147* (2013.01); *H01L 2225/06513* (2013.01); *H01L 2225/06541* (2013.01); *H01L 2225/06544* (2013.01); *H01L 2924/00014* (2013.01); *H01L 2924/1461* (2013.01); *H05K 2201/10954* (2013.01); *Y10T 29/49155* (2015.01)

(56) References Cited

FOREIGN PATENT DOCUMENTS

| EP | 2075828 | A1 * | 7/2009 | ............. H01L 21/60 |
| EP | 2 421 037 | | 2/2012 | |
| WO | 2010 119652 | | 10/2010 | |

OTHER PUBLICATIONS

Su, Y. A. et al., "Rate-dependent properties of Sn—Ag—Cu based lead-free solder joints for WLCSP", Microelectronics Reliability, vol. 50, pp. 564-576, (2010).
Che, F. X. et al., "The study of mechanical properties of Sn—Ag—Cu lead-free solders with different Ag contents and Ni doping under different strain rates and temperatures", Journal of Alloys and Compounds, vol. 507, pp. 215-224, (2010).
International Search Report Issued Mar. 21, 2013 in PCT/EP12/075364 Filed Dec. 13, 2012.

* cited by examiner

FORMING OF AN ELECTRIC CONNECTION OF THE VIA TYPE

TECHNICAL FIELD OF THE INVENTION

The present invention generally relates to the electrical interconnections of electronic components, and more particularly the provision of interconnections perpendicular to the plane of the components assembled in a three-dimension stacking of electronic components. Such components may be any electronic device, and more particularly microelectronic or nanoelectronic ones, or interposers.

STATE OF THE ART

The increasing density of devices produced by the microelectronics industry now requires the three-dimensional (3D) assembling of independent components as a stack of microelectronic components currently implementing electronic functions but which may also comprise electrical, optical or even mechanical functions. It must be possible to interconnect such microelectronic components to provide the desired function. A technique widely used for interconnections between the various planes of a stack consists in creating interconnecting vias perpendicular to the plane of microelectronic components. So-called TSV, from the acronym <<through-silicon via>>, such vias enable the interconnection of both faces of the same substrate, which is most often made of silicon, and thus of the microelectronic components.

Such a via, or TSV, which must go through the whole thickness of a substrate whereon a certain type of microelectronic components has been positioned, is traditionally executed in three main steps, which are respectively illustrated in FIGS. 1a, 1b and 1c.

The TSV must first be electrically insulated from a substrate 200 it goes through. A very good electric insulation must be provided so as to avoid any current leakage between the conductor composing the via and the substrate. This is more particularly true for the radiofrequency applications wherein the vias must be perfect wave guides.

As shown in FIG. 1a, this is the aim of forming an insulating dielectric layer 210 in the hole 100 previously created in the substrate 200 which goes therethrough. Typically, the substrate 200 is made of silicon and the layer 210 is obtained by depositing or growing silicon dioxide (SiO2) from the substrate or by depositing SiON.

Then, as illustrated in FIG. 1b, a continuous conducting bottom 211 must be deposited. The continuous conducting bottom is intended for, on the one hand, enabling an electrolytic filling of the TSV and, on the other hand, preventing, in the course of such operation, any diffusion to the substrate of the conducting material which composes the TSV by creating a diffusion barrier. A widely used technique, so-called ECD, the acronym of <<electrochemical deposition>>, makes it possible to form the TSV from an electrolyte by electrically depositing a metal such as copper. The quality of the result of the electrolysis widely depends on the characteristics of the layer 211 and more particularly on the continuity and the thickness thereof. It should be noted that a lithography executed prior to the ECD only leaves the desired deposition areas open, i.e. the internal surfaces of the cavities formed by the holes 100.

FIG. 1c illustrates the final result. The filling intended to form the TSV is partial, and thus forms a hollow cylindrical conductor, as shown, which may also be solid.

The steps of forming a TSV described briefly above, become particularly critical with the decrease of the form factor of the holes wherein the TSV are formed. Most often having a circulation section, but not at all restricted to such shape, the form factor is defined here as being the ratio of the diameter of the hole to the depth thereof required to go through the substrate. In a three-dimension assembly, it is very advantageous to be able to obtain low form factors in order to increase the density of interconnections perpendicular to the plane of the microelectronic components. However, for form factors typically lower than 0.5, the techniques currently used to form the dielectric layer 210 and the continuous conducting bottom 211 used as a protection barrier reach their limits. Such techniques, of the PVD or PECVD types, i.e. the acronyms for <<physical vapor deposition>> and <<plasma-enhanced chemical vapor deposition>>, no longer make it possible to obtain uniform and continuous deposits. For example, for a form factor of 0.5 and a depth of 200 µm (1 µm=$10^{-6}$ m), a deposit of 4 µm of dielectric on the surface results in a deposit of 0.6 µm only on the bottom and the centre of the via and in an even smaller deposit of 0.3 µm on the sides in the lower part of the cavity.

FIG. 5 illustrates a defective insulation in the dielectric layer 210 which does not cover the whole height of the hole, more particularly in the area 107. Faulty insulation, and more particularly at the bottom of the holes, where the thickness of the deposit tends to be smaller, as shown may occur in holes 100 having a low form factor. If the substrate 200 has been over-etched at the bottom of the hole 100 (through <<notching>>) the deposit is then absent at the bottom of the cavity since the flanks are masked.

Generally speaking, the current techniques used for producing a conducting element in a via raise a problem as regards the quality of the electric conduction produced, and more particularly as regards the electric insulation between the hole of the via and the through conducting element.

An object of the invention then consists in providing a technique at least partially solving the current problems met when forming electric connections such as TSVs.

Advantageously, with the present invention, the difficulties met with depositions in the hole will no longer be penalizing as regards the quality of the insulation. It should be noted that a defect of this type is advantageously compensated by the method of the invention wherein a pillar having a smaller section relative to the hole may preferably be used as a conducting element, which leaves some space which may preferably be used as an insulant in such critical places, with the presence of a vacuum, of air or another gas able to act as an electric insulant.

In an advantageous and non restrictive embodiment, the invention makes it possible to form TSVs with low form factors.

Other purposes, characteristics and advantages of this invention will become apparent upon examination of the following description and accompanying drawings. It is understood that other advantages can be included.

SUMMARY OF THE INVENTION

The present invention relates to an electronic component comprising a substrate, at least a hole at least partially going through the thickness of the substrate and an electrically conducting element positioned in the hole and so configured as to form an electric connection through the hole.

The electrically conducting element advantageously comprises an electrically conducting pillar the height of which is oriented according to the thickness of the substrate. It also includes a space between at least a part of the wall of the hole and a part of the peripheral wall of the pillar. The space may be under vacuum, or at least partially filled with air or another dielectric gas.

It should be noted that the pillar is advantageously self-supporting and requires no continuous load bearing area on the periphery thereof to preserve the integrity and the shape thereof through the hole. This makes it possible to create or to preserve a space between at least a part of the height of such pillar and the wall of the hole facing same. Then any risk of electric conduction between the pillar and the wall of the hole is prevented.

The space is preferably provided during the step of execution of the pillar in the hole, which may include a step of creation of the pillar by electrochemical deposition. The space is advantageously generated by a reduced diameter of the pillar relative to the diameter of the hole which may be defined by the internal diameter of a wall either of an insulating layer directly formed on the wall of the cavity of the hole in the substrate, or of a continuous bottom layer formed on said insulating layer.

In a non restrictive embodiment, the pillar is completely formed by electrochemical deposition.

The following non restrictive options belong to the advantageous characteristics of the present invention and may be combined at will:

the pillar comprises a holding member in contact with the wall of the hole. A contact surface is thus formed between the first substrate and the pillar, more particularly for holding purposes and possibly for the mechanical centering of the pillar in the hole or still for the confinement of a part of a residual volume between the peripheral surface of the pillar and the wall of the hole. The holding member holds the pillar in position, thus preventing any lateral movement thereof.

the holding member is a segment of the height of the pillar, the holding member is superimposed on a shaft part of the pillar and the material of the holding member is different from the material of the shaft part and has an elastic limit lower than that of the material of the shaft part.

the holding member is so configured as to close the space and make it airtight.

the holding member is located at a first end of the hole, the component comprises at least another holding member spaced from the first holding member according to the height of the pillar, it comprises an electric connection area at a second end of the hole, and the pillar comprises a conducting member in contact with the electric connection area and with a shaft part of the pillar. The material of the conducting member is then advantageously different from the material of the shaft part and has an elastic limit lower than that of the material of the shaft part.

the space is closed, the wall of the hole is at least partially made of the surface of an insulating layer, the substrate is at least partially made of a semi-conducting material, the pillar comprises a shaft made of copper, the material of the holding material and/or the material of the conducting member melts at a lower temperature than the material of the pillar shaft, the centering members divide the space into several chambers.

the component comprises several holes and several pillars, at least two of which have a different height.

the space is at least partially filled with at least one dielectric material. Said material may be air, another gas with no electric charge or a solid insulating material such as a polymerized resist The invention also relates to a method for creating an electric connection through at least a part of the thickness of a substrate of an electronic component, comprising:

forming a hole at least partially going through the thickness of the substrate;

forming an electrically conducting element positioned in the hole and so configured as to form an electric connection through the hole;

characterized in that forming the electrically conducting element comprises:

forming an electrically conducting and self-supporting pillar belonging to the electrically conducing element, and the height of which is oriented according to the thickness of the substrate, forming a space between at least a part of the wall of the hole and a part of the peripheral wall of the pillar.

The method may have at least one of the following strictly optional characteristics:

forming the pillar comprises forming, in the pillar, a holding member, with the method further comprising contacting the holding member with the wall of the hole, the contact between the holding member and the wall of the hole is obtained by plastic deformation of the holding member, with the stress exerted to obtain such plastic deformation being preferably so configured as not to plastically deform at least another part of the pillar such as a pillar shaft.

the plastic deformation of the holding member is executed by compression or thermo-compression of the pillar present in the hole.

forming the holding member comprises the deposition, on one shaft part of the pillar, of a layer of a material composing the holding member, with said material being selected so that the elastic limit thereof is lower than that of the material of the shaft part, the contacting is so configured as to close the space and make it airtight.

the holding member is positioned at a first end of the hole, forming the pillar comprises forming at least another holding member spaced from the first one according to the height of the pillar, the material of the holding member is an alloy, with the method comprising the transformation of said alloy into an intermetallic material after the holding member has come into contact with the wall of the hole.

forming the pillar comprises the production of a conducting member on the base of a shaft part of the pillar, with the material of the conducting member having an elastic limit lower than that of the material of the shaft part, with the method further comprising the plastic deformation of the conducting member by compression or the thermo-compression of the shaft, in contact with the electrically conducting supporting member.

it comprises the use, as the supporting element, of an electric connection area formed at a second end of the hole.

forming the pillar comprises forming a pillar shaft having a diameter smaller than the diameter of the hole and forming the holding member having a diameter smaller than the diameter of the hole; and wherein the contacting comprises the compression or the thermo-compression of the holding member so as to increase the section thereof until it contacts the wall of the hole.

forming the pillar comprises a step of producing the pillar from a second substrate different from the substrate and a step of insertion of the pillar into the hole, advantageously, the pillar is so executed that, after the insertion thereof into the hole, a space is present between at least a part of the pillar and the wall of the hole. In this situation, the alignment tolerances between the first and the second substrates may be larger while ensuring a correct insertion of the pillar into the hole.

Forming the pillar may also comprise a step of producing the pillar from a second substrate different from the substrate and a step of insertion of the pillar into the hole, The step of producing the pillar may comprise forming a pillar shaft having a diameter smaller than the diameter of the hole and forming the holding member having a diameter greater than the diameter of the hole.

The contacting comprises the plastic deformation of a peripheral part of the holding member when in contact with a part of the surface of the hole during the step of insertion.

According to other optional characteristics, the method of the invention may be such that:

the material composing the holding member is so selected as to have an elastic limit lower than that of the material of the part of the surface of the hole.

the second substrate is removed after the step of insertion so as to leave the pillar only in the substrate, forming the pillar comprises:

1°) a step of filling the hole with resist;
2°) a step of lithography in the resist so configured as to form a pillar pattern;
3°) a step of depositing, into the pattern, at least one layer of the material composing the pillar;
4°) and, preferably, a step of at least partially removing resist.

The method may comprise, prior to the step of filling, a step of depositing an electrically conducting continuous bottom layer into the hole, with the step of depositing being executed by electrochemical deposition.

The first substrate is preferably completely or partially made of a semi-conducting material for instance silicon or germanium, but may also be made of a dielectric-based material or glass.

The second substrate may be removed, or not, after the step of insertion of the pillar into the first substrate. When the second substrate is kept, it may comprise electronic elements or components.

The method may comprise, after the step of insertion or production of the pillar in the hole, a step of compression or thermo-compression of the pillar in the hole so as to reinforce the electric contact between the bonded pillar and the substrate.

Advantageously, it comprises the provision of a base made of a conducting material so positioned as to match one end of the hole and constituting a conducting member. A support for the pillar and a continuous electric conduction toward a face of the first substrate are thus provided.

Advantageously, the holding member is made of a material melting at a low temperature, for instance made of a tin or indium alloy. Advantage can thus be taken from the possible plastic deformation properties for such material at a relatively low temperature.

Advantageously, the conducting member is made of a material melting at a low temperature which may be the same as or different from that of the holding member and for instance tin or indium alloy. For these members, materials melting at a low temperature, i.e. having a melting temperature much lower than that of the rest of the pillar or at least the shaft thereof, which must remain rigid during the insertion, will preferably be chosen.

The intermediary space between the wall of the hole and the periphery of the pillar may be closed at the ends of the hole, specifically in the particular case wherein the second substrate is removed after the step of insertion.

Advantageously, the pillar and preferably the shaft thereof, is wholly or partially made of copper.

Advantageously, the insulating layer at least partially composes the wall of the hole.

According to an alternative solution, the insulating layer is deposited prior to the step of insertion, onto the second substrate so as to insulate the pillar, except for the end of the pillar intended to come into contact with the connection area.

The pillar is preferably executed from a second substrate, which may be made of a semi-conducting material.

The present invention also relates to an electronic component obtained according to the method of the invention.

The invention also relates to an electronic system which comprises at least two electronic components of the invention so stacked that the electrically conducting elements thereof are in contact with one another.

BRIEF DESCRIPTION OF THE FIGURES

The goals and objectives as well as the characteristics and advantages of the invention will emerge better from the detailed description of an embodiment of this latter, illustrated by the following accompanying drawings in which:

FIG. 10 more precisely shows the initial condition of a hole.

FIG. 11 shows a preparation phase with depositions.

FIG. 12 shows the creation of a pattern in the resist deposited in the hole.

FIG. 13 shows an electric connection with a pillar resulting from the preceding steps, after removal of the resist.

The drawings attached are given as examples and are not limiting to the invention.

DETAILED DESCRIPTION OF THE INVENTION

As mentioned above, the invention relates to the forming of electric connections such as vias through any microelectronic component, comprising any type of device produced using microelectronic means. The terms <<microelectronic component>> more particularly encompass micromechanical or electromechanical devices such as MEMS (micro-electromechanical systems) or NEMS (nano-electromechanical systems) as well as optical or optoelectronic devices (such as MOEMS (micro optical electromechanical systems)).

The via hereunder, also called TSV, may even be executed on a device with an electric function such as a probe-card.

The electric connection of the component provided here may be used to electrically connect two elements of the electronic component placed on different faces or to connect the component to at least another electronic component which may be of any type.

The invention may also be used for electrically connecting two electronic components separated by the component comprising the electric connection of the invention.

Prior to explaining in details the method of the invention, and more particularly the implementation of a step of bond, or as an alternative embodiment, the complete forming of the pillar 300, from the substrate 200 of the component, structures are described hereafter, which disclose advantageous embodiments of the electronic component of the invention.

Figure 4:
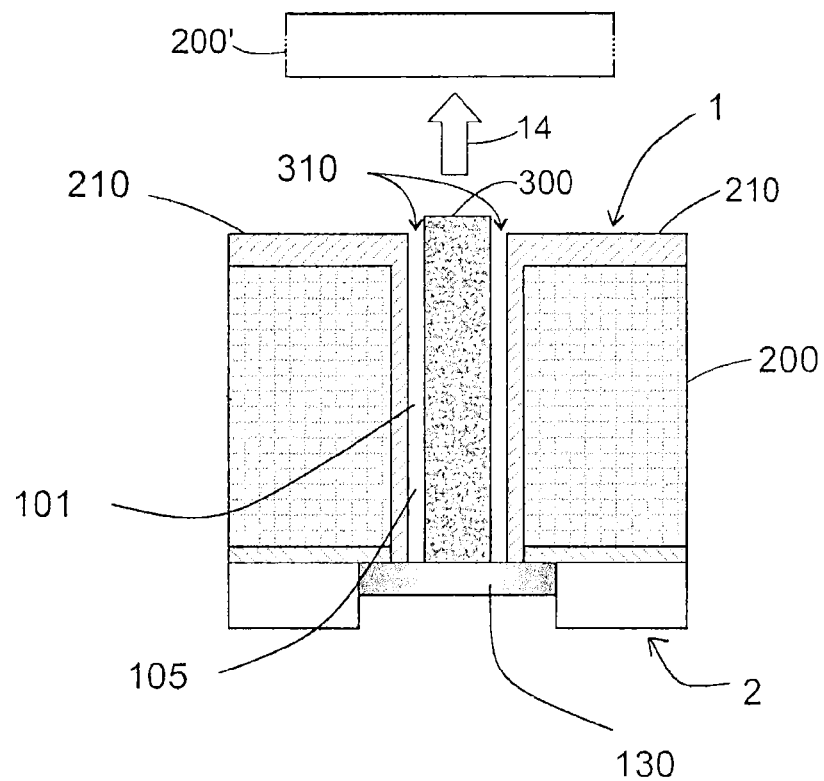
FIG. 4 shows an example of a TSV structure obtained with the method of the invention after removal of the bond substrate.

A first configuration of a via is illustrated in FIG. 4 which shows a self-supporting pillar in contact, at its base, with a connection area 130. Self-supporting means that the pillar 300 is able to support its own weight. As shown, it may be held in the hole 100, depending on its height, simply through the base resting on the connection area.

Here the pillar 300 is made in one piece of only one material. This is a solid cylindrical element having a circular cross-section.

Its peripheral wall, which matches its external surface opposite the wall 101 of the hole 100 is not in contact with the wall 101 on at least a part of the height of the pillar 300. A space 105 is thus obtained. In the case illustrated in FIG. 4, such space 105 is closed at one end of the hole 100 at the base of the pillar (conventionally called the second end in the following) thanks to the connection area 130 on a face 2 of the component. On the contrary, the space is open in the upper part of the hole (which is conventionally called the first end in the following).

In FIG. 4, the wall 101 of the hole 100 is formed, at least partially, by an insulating layer 210, obtained for instance by deposition, and advantageously covering on the face 1 of the component a part of the substrate 200 (hereinafter also called the first substrate) located on the first end side.

Figure 6A:
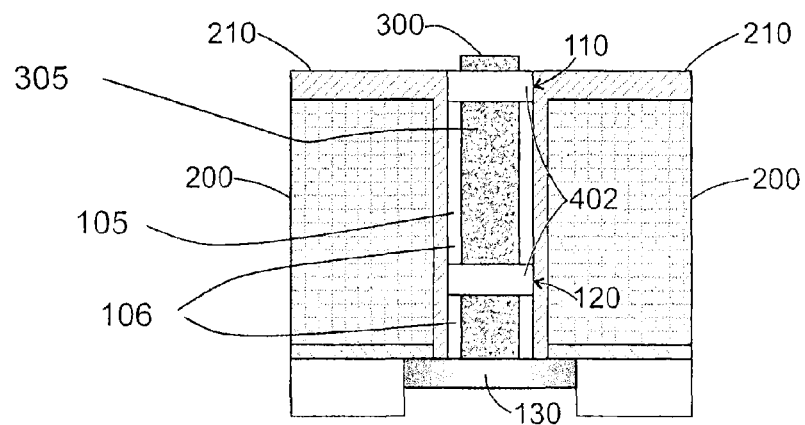
FIGS. 6a to 6c illustrate various composite pillars using at least two types of different materials.

An alternative embodiment of the case shown in FIG. 4 is shown in FIG. 6a, wherein the pillar 300 is composite in that it comprises, according to the height thereof, several segments having different configurations. More particularly, the pillar 300 comprises at least a shaft part. The shaft here means the main body of the pillar preferably composing more than one half of the height thereof and/or made of a material having an elastic limit higher than the other parts of the pillar.

The diameter of the shaft is advantageously smaller than the diameter of the hole so as to produce the space 105. In the Figure, the shaft comprises several parts 305 separated by other components of the pillar. Two centering members 402 are thus formed: starting from the base of the pillar, the latter comprises a shaft part, then a holding member 402 in contact with the wall 101 of the hole 100 in an area 120, then a second part 305 of the pillar, then another holding member 402 also in contact with the wall 101 in the area 110, then another shaft part, and the areas 110, 120 are preferably cylinder/cylinder supports. Preferably, the contact is such that airtight closing is provided. The contact of the holding member 402 is thus advantageously oriented according to the height of the hole 100. The contact preferably concerns at least a part of the wall of the hole 100 oriented according to the height of the latter.

Only one holding member 402 may be formed, or more than two. A holding member 402 is preferably positioned at the first end of the hole 100. A large closed space 105 is thus formed according to the height of the pillar 300.

One function of the holding member may be to laterally wedge the pillar 300. The holding member(s) 402 may be electrically conducting so as to ensure a continuous conduction according to the height of the pillar 300.

The presence of several centering members 402 divides the space 105 into several chambers 106.

Generally, each holding member 402 may be a part, and advantageously not the whole of the height of the pillar 300. This is preferably a segment matching an area superimposed on other areas, according to the height of the pillar 300.

Figure 6B:
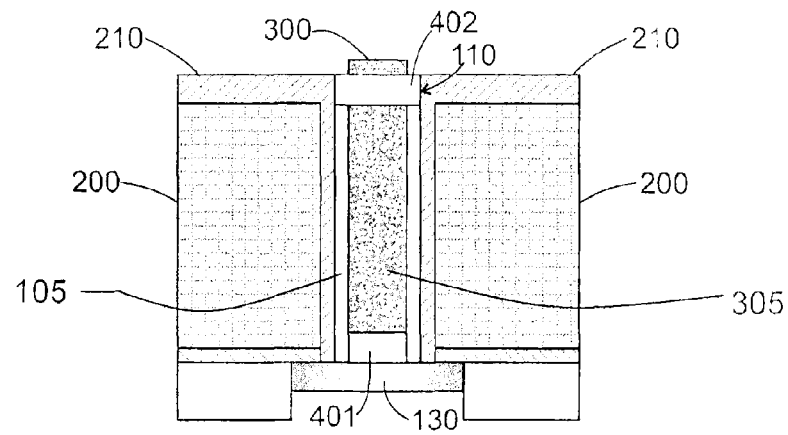

FIG. 6b illustrates the forming of a space 105 in one piece, with only one holding member 40, flush with the face 1 of the component close to the first end of the hole 100. A conducting member 401 forms a connection between a shaft part 305 of the pillar and the electric connection area 130 at the base of the pillar 300

The conducting member 401 is advantageously so configured as to optimise the electric contact between the pillar and the area 130.

Figure 6C:
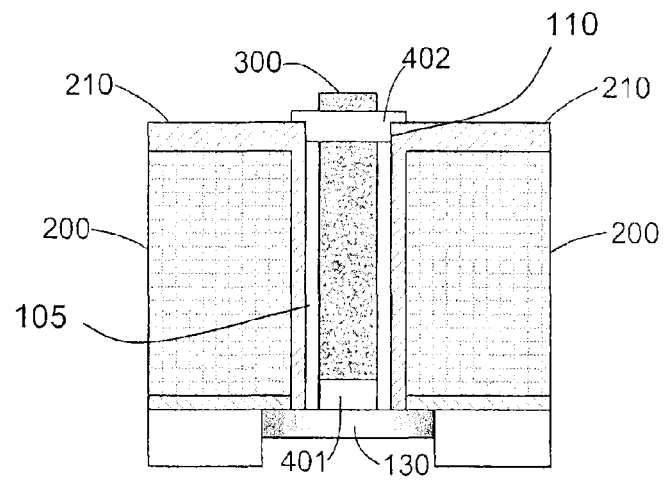

An alternative embodiment of FIG. 6b is shown in FIG. 6c with a holding member 402 forming a plug for the space 105 and having a cylindrical part applied to the wall 101 of the hole 100 in the area 110. The member 402 is also provided with a flange, for instance made of a cylindrical part having a larger diameter and resting on the edge of the hole 100 close to the face 1 of the component close to the first end of the hole 100.

Figure 15:
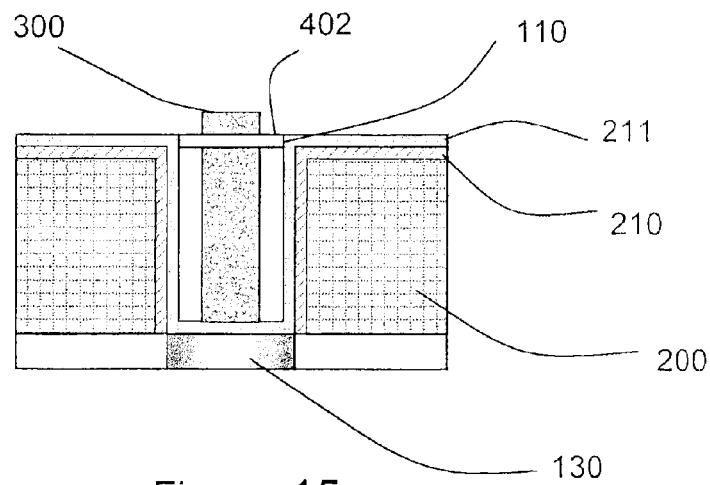
FIG. 15 shows the configuration of the composite pillar of FIG. 14 after the plastic deformation of a part of the pillar.

FIG. 15 shows another alternative electronic connection structure in the component, wherein the pillar is provided with only one member 402. Such member is applied, 110, onto the wall 101 of the hole formed here by a continuous bottom layer 211. Advantageously, at the base of the pillar, the continuous electrically conducting bottom layer 211 provides the electric connection between the pillar 300 and the connection area 130.

For information, the space 105, whether in one piece or divided into several chambers 106, may extend on at least 50% of the height of the substrate 200 (i.e. the thickness thereof).

Some characteristics of the various embodiments described above will be explained in greater details in the following description, which further discloses exemplary embodiments of the electric connection of the via type. The various embodiments of the invention, i.e. the component, the method or the electronic system associating components, may be combined, as regards their characteristics. Thus, the pillar of FIG. 15 might for instance comprise several centering members 402, as is the case in FIG. 6*a* or a conducting member 401.

Figure 2A:
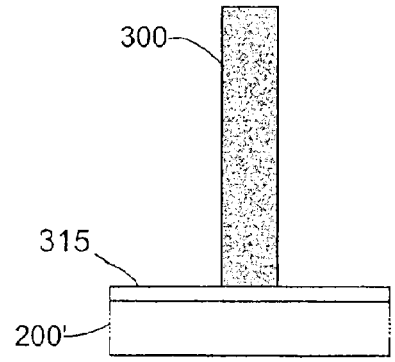
FIGS. 2a to 2c illustrate a principle of implementation of the invention in an embodiment wherein a conducting pillar is prepared on a bond substrate which will be used to fill a TSV on the functional host substrate.

Referring to FIGS. 2*a, b, c,* 3*a, b, c,* 4 and 6*a, b, c,* a first embodiment for producing an electronic component comprising the creation of an electric connection through the substrate 200 is described hereafter. According to this first embodiment, a part of the via is created on a second substrate 200', with the first substrate 200 and the second substrate 200' composing together two modules to be assembled.

Description of the Modules to be Assembled:

The following description explains the forming of a via in a substrate, using the invention. This case can, of course, be extended to a plurality of vias in said substrate within the scope of the invention.

Figure 2B:
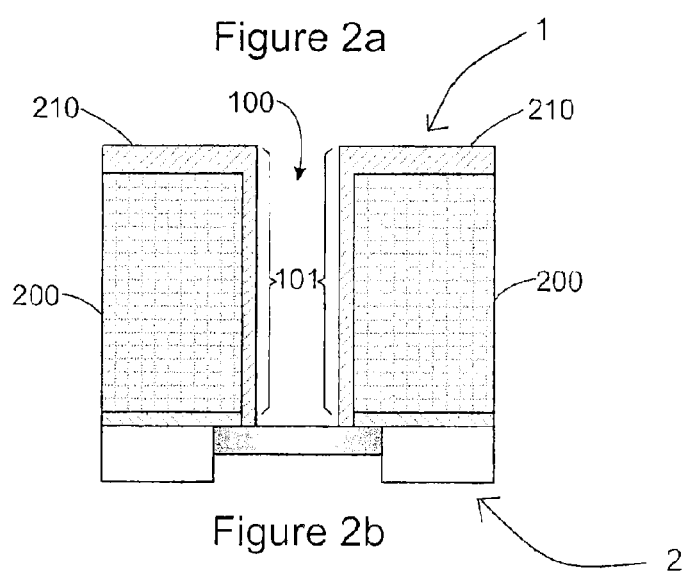
Figure 2C:
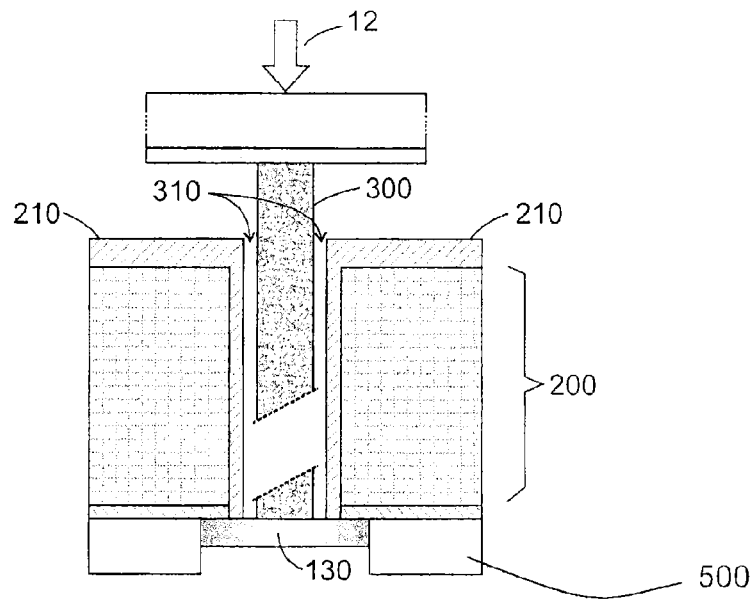

FIGS. 2*a* to 2*c* illustrate the principle of the implementation of the invention wherein the filling of the TSV is prepared from a second substrate.

FIG. 2*a* shows this second substrate 200' whereon a conducting pillar 300 is grown, which will be used for filling the TSV, as explained hereunder. The second substrate 200' is a bond substrate or <<hand>> advantageously removed after bond of the pillar. The invention makes no assumption as to the nature of the conducting pillar 300, nor as to how it has been produced. An exemplary forming of a pillar is however described hereunder in FIGS. 3*a* to 3*c* wherein, as in the prior art, the latter is grown by electro-chemical deposition (ECD) for instance of copper. In this case, a continuous conducting bottom must also be provided for the electrolysis, which is masked in order to define the position of the pillars therein. However, it should be noted that this is a completely flat layer 315 disposed on the second substrate 200' the structure and the dimensions of which can be perfectly controlled so that the electrolysis can be carried out under the best possible conditions. It should also be noted that in this embodiment, pillars can be grown, which are not necessarily composed of one and only one conducting material. Composite pillars can be provided, with elements 401 and 402 made of different materials, shapes and dimensions, and elements 402 also potentially different.

Figure 3A:
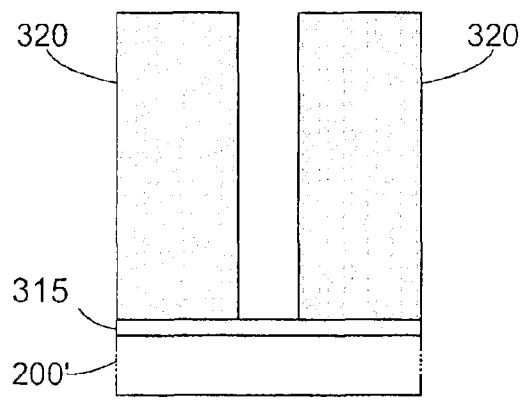
FIGS. 3a to 3c illustrate an example of production of a pillar on a bond substrate.
Figure 3B:
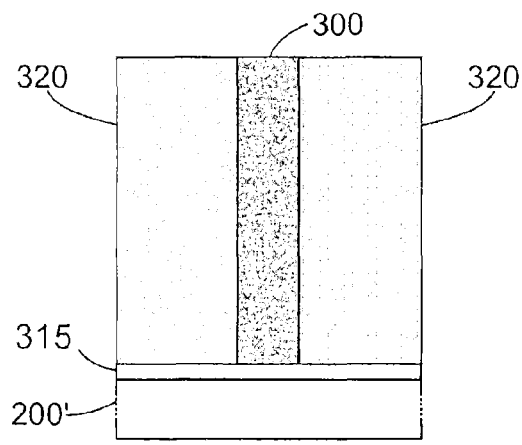
Figure 3C:
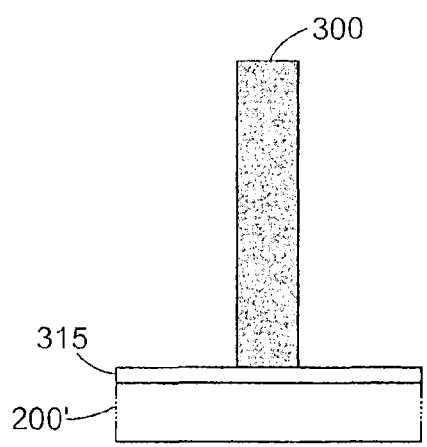

FIGS. 3*a* to 3*c* show, in greater details the creation of the pillar 300 on the second substrate 200'.

FIG. 3*a* shows the aperture provided in the photosensitive resist deposited during lithography, which makes it possible to define the position and the section of the pillars on the surface of the bond substrate 200' and the layer 315 forming the continuous conducting bottom. The thickness of the resist deposited corresponds to the height of the pillar 300 to be obtained.

FIG. 3*b* shows the structure obtained upon completion of the electrochemical deposition of the material which the TSVs are made of, typically copper, the growth of which is carried out in the areas not masked by the resist, thus creating, by electrolysis, a pillar 300.

FIG. 3*c* shows the structure obtained after removal of the resist. Such structure is compliant with that of FIG. 2*a*.

FIG. 2*b* shows the first substrate 200 which has the same structure as in the prior art, with the remarkable exception that it not necessary to form therein the continuous conducting bottom for the electrochemical deposition. Only the insulating dielectric layer 210 is present in the illustrated case. It constitutes the wall 101 of the hole 100.

Bond Proper:

FIG. 2*c* illustrates a step of bond of a pillar from the second substrate 200' which is the handle, on the functional host substrate, i.e. the first substrate 200. The pillar 300 is aligned opposite the hole 100 then slightly compressed by a force applied 12, so as to create electric continuity with the lower connection area 130 made of metal. Contact surfaces are advantageously deoxidized beforehand, in order to facilitate the electric contact.

The support of the host substrate 200 which contains the hole(s) forming the cavities intended to receive the pillars is preferably so designed as to obtain a good distribution of compression, by offering a large resting surface bearing reference 500. The applied force, required for the plastic deformation of the member 402 is however relatively small, of the order of one kilogram, for instance. In addition, the major part of the energy supplied by the applied force is converted into energy deforming the element 402.

Figure 9:
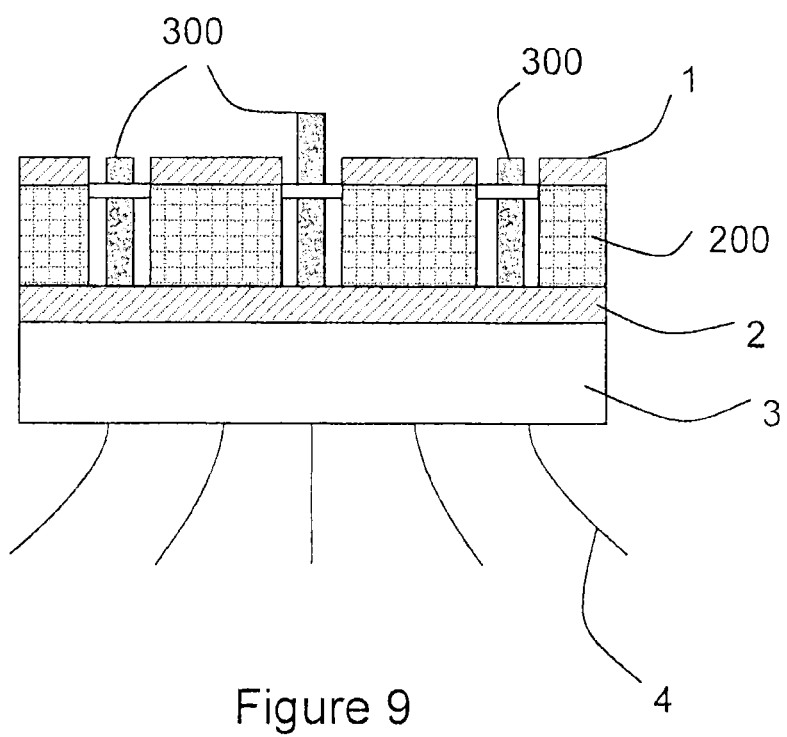
FIG. 9 shows the possible integration of the invention in probe-cards applications.

The metallic contact at the bottom of the hole 130 can advantageously be reinforced at the base thereof not to be torn during bond of the pillar, more particularly if the pillar 300 is totally rigid. The resting surface 500 may thus also be used to compensate the compression stress induced by the pillar 300 and transmitted by the area 130. The supporting surface 500 may specifically be in contact with the face of the area 130 opposite the pillar 300. The surface topology may thus contain elements to be used or not for making the electronic circuits, which participate in making a supporting surface, as shown in FIG. 9.

Depending on the materials selected, the bond may be executed chip per chip or wafer per wafer, hot or cold. The bond of the microelectronic component on the substrate may also be executed from alignment patterns like a conventional bond of microelectronic components. The pillar(s) 300 is/are positioned opposite the cavities, and centered at a height taking into account the height of the pillars. The pillars are then inserted into the cavities formed by each corresponding hole 100 put in contact using a force 12 (cf. FIG. 2*c* where the arrow symbolises an effort according to the height of the pillar 300) adapted to the number and to the surface of the pillars.

The bond substrate or handle substrate 200' may be separated from the bonded pillar 300 by chemical means, i.e. for instance, a selective etching of the layer 315 at the root of the pillar, or mechanical means, for example shearing, respectively. For the configuration shown in FIGS. 2*a* to 2*c*, the pillar is advantageously made, as explained in FIGS. 3*a* to 3*c* of a metal, for example copper, which is deposited onto a continuous bottom 315 made of titanium and copper. In this case, a hydrogen peroxide ($H_2O_2$) and sulphuric acid ($H_2SO_4$) bath is used to chemically attack the base of the pillar 300 until the handle substrate 200' is separated from the pillar 300. In a configuration with a conducting member 401, a layer of a material melting at a lower temperature than the rest of the pillar (not shown in FIGS. 2*a* to 2*c*) is added between the continuous bottom 315 and the pillar 300, and a shearing of the handle substrate relative to the substrate containing the cavity can be executed to separate the pillar from its support. Such layer made of a material melting at a low temperature located at the base of the pillar is obtained by electrolysis, like the rest of the pillar. Advantageously, the selection of the material at the base of the pillar 300 on the substrate 200' will be a material having a melting temperature lower than that which can be inserted into the body of the pillar 300 (like the member 402 or the member 401).

The bonded pillar may have substantially the diameter left by the insulating dielectric layer 210 in the hole. More advantageously, it may also have, as shown, a smaller diameter, for example 70 μm for a hole with a diameter of 80 μm in the case of a pillar made of copper and a tin alloy. The insertion of the pillar 300 will then be facilitated by limiting the required alignment for the bond substrate 200' on the substrate 200 and the space 105, present between the pillar and the inner walls of the hole, contributes to enhance the electric insulation provided by the dielectric layer 210. The space 105 between the pillar and the substrate 200 can also be filled with a polymeric material used as an electric insulator.

FIG. 4 shows an example of a TSV structure obtained with the method of the invention after removal 14 of the bond substrate 200'. FIG. 4 shows the case when the pillar has a smaller section to leave an air space between the latter and the walls of the hole, with the above-mentioned advantages. In this case, the wall 101 of the hole 100 is made of an insulating dielectric material as the layer 210 described above.

The electric conduction does not generally concern the whole diameter of the pillar and thus it is not necessary to completely fill the pillar as shown in the appended Figures. The latter may also be hollow, i.e. having a hollow cylindrical shape.

FIGS. 6a to 6c illustrate various cases of composite pillars, i.e. pillars using at least two types of different materials with one being more malleable than the other so as to give special advantageous characteristics to the TSVs produced according to the method of the invention, as described above.

FIG. 6a shows a first type of a structure using a composite pillar 300 the composition of which has varied in the course of the growing thereof, for instance, by electrolysis. In the example of FIG. 6a, the composite pillar comprises, in its height, two areas corresponding to the centring members 402 of the same malleable material or of two different malleable materials, one for each area. The pillar 300 is for instance executed with the following steps, comprising the execution of a first shaft part made of copper corresponding to the pillar and a second part made of tin (which corresponds to the areas 402). The areas 402 have a minimum width (or diameter if the section is circular) which is greater than the width (or the diameter) of the rest of the pillar. To obtain this result, copper, which will compose the main body of the filling pillar 300 and a tin alloy, which is a metal having a lower elastic limit and which is in addition malleable at room temperature may advantageously be associated. This association gives the composite pillar very advantageous properties:

under the effect of pressure 12 illustrated in FIG. 2c and exerted on the bond substrate 200' upon insertion of the pillars, the material of the conducting member 402 will be crushed by plastic deformation until it reaches the walls 101 of the hole and thus closes the cavity formed by the hole 100. FIG. 6a and the following show the layers of malleable material of a pillar after crushing thereof and closing the cavity. The various sections of the cavity thus formed will be insulated from the external atmosphere and will no longer be liable to be damaged by the physico-chemical treatments to be applied onto the surface of the device being produced. For example, the above-mentioned etching of the base of the pillar which enables to release the bond substrate 200' will not affect the TSV being produced.

Additionally, crushing the centering members 402 in the exemplary FIG. 6a will enable a self-centering of the pillar in the hole, thus providing an air space around the pillar, which significantly participates in the electric insulation of the latter, as seen before.

Examples of pressure 12 which may be exerted: 64 pillars 300 58 μm in initial diameter, made of copper and a tin alloy, are crushed by a load of 3 kilograms (kg).

A tin (Sn)-based alloy suitable to form a composite pillar 300 will for example also include silver (Ag) and copper (Cu). Other materials may be suitable, for instance indium (In). A lead (Pb)-based alloy might also be suitable but raises problems as regards pollution. As a matter of fact the whole microelectronic industry tends to ban the use of lead.

Figure 5:
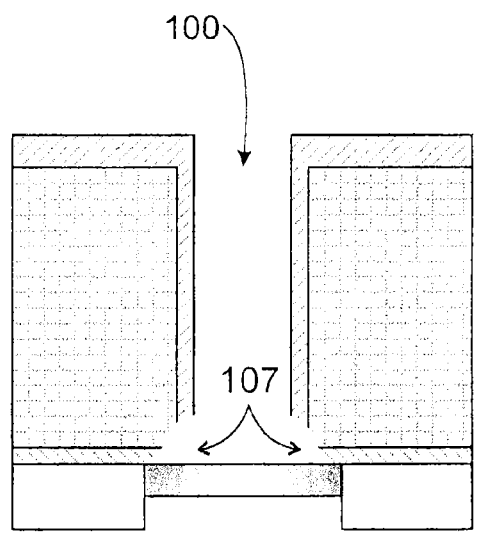
FIG. 5 illustrates the case of a faulty insulation of the dielectric layer at the bottom of the hole intended to receive the conducting pillar.

FIG. 6b illustrates the case when a conducting member 401 made of a different material and more particular tin alloy, is provided at what is now the lower end of the pillar 300 after the insertion thereof into the hole 100 and separated from the bond substrate 200'. Intended to come into contact with the connection area 130 (the one which will enable the interconnection with the underlying element of the three-dimension assembly) the purpose of the conducting member 401 is to improve the electric quality of this contact. If the end of the pillar 300, i.e. the area 401 in this case, is made of a material more malleable than the one used for other parts such as the shaft or the rest of the pillar 300, for example copper, the compression generated by the force 12 will have to be controlled so that it does not contact the edges of the cavity formed by the hole 100, where insulation is potentially failing, as shown in FIG. 5. It should be noted that the selection of the materials for making the pillar 300 more particularly concerns the parameter of the elastic limit. Such elastic limit gives the maximum stress that a material can withstand by remaining within its so-called elastic reversible deformation phase.

Generally speaking, things are worked out so that the elastic limit of the materials composing the parts of the pillar 300 forming the centering members 402 and the conducting member 401 is lower (for instance by at least 50%) than that/those forming the shaft. It should be noted that the same material or different materials may be used for the holding member 402 and the conducting member 401.

The thickness of the malleable materials used for producing the plastically deformable areas of the composite pillars can be selected according to the elastic limit ratio of the materials they are made of.

For instance, if copper is selected to form the shaft parts 305 of the pillar 300 and tin or indium is selected to form the parts such as the holding member 402 and the conducting member 401, the following properties are obtained:

| | Melting T (° C.) | CTE (ppm/° C.) | Rupture stress (MPa) | Elastic limit (MPa) | Max. elongation (%) | Young's modulus (GPa) |
|---|---|---|---|---|---|---|
| Copper | 1084 | 17 | 230 | 60 | 30 | 120 |
| Pure tin | 232 | 20 | 15 | 10 | 75 | 42 |
| indium | 156 | 29 | 3 | 2 | 50 | 13 |

As the lateral and vertical deformations of the members 401 and 402 are elastic ones, the shearing stress limit law for the material for a given stress, for a given deformation velocity and for a given temperature should be known to calculate the initial diameter of the parts of the pillar 300 which can be obtained. Such laws, specific to each material, are accessible from compression tests. For a tin, silver and copper alloy, currently called SAC, the diameter of the pillar has been doubled close to the member 401 or 402, for a thickness of a few microns. The volume of the plastically deformable member is almost constant in coarse approximation during compression.

The narrower the pillar 300, the better the insulation since the space 105, such as an air space, will then be larger. The malleable layer 402 located closest to the surface, at the first end of the hole 100, is also used as a plug. Such plug advantageously protects the cavity against any intrusion. In any case, a space 105, such as an air space of a few microns (for instance from 1 to 15 microns), around the pillar, can be considered.

FIG. 6c illustrates an alternative solution wherein the malleable layer 402 partially comes out of the insulating layer 210 superimposed on the substrate 200. In this situation, or the preceding ones, the holding member 402 can initially be created with a diameter greater than that of the pillar shaft and that of the hole 100 so that the member 402 approaches the edge of the hole 100 upon insertion and it is plastically deformed when in contact with the edge of the hole 100. The configuration of FIG. 6c is obtained by stopping insertion before the member has totally entered the hole 100.

In order to prevent the centering member(s) 402 from damaging the wall 101 of the hole 100 when resting thereon, the surface of a material the elastic limit of which is above that or the member(s) 402 is preferably selected.

The technique used for producing the vias going through a substrate of the TSV type according to the method of the invention which is described in the Figures above has many advantages, with the main ones being recalled hereafter.

The pillars 300 produced separately can be easily controlled and characterised in the course of the production since they are protruding from the bond substrate 200'.

The electro-deposition of the pillars is facilitated by the fact that the continuous bottom 215 required for the electrolysis is perfectly plane since it is deposited now, prior to the growing of the pillars, onto the bond substrate, which is plane too. The continuous bottom can thus be perfectly homogeneous on the whole of its surface, both as regards its thickness and its composition.

Figure 1A:
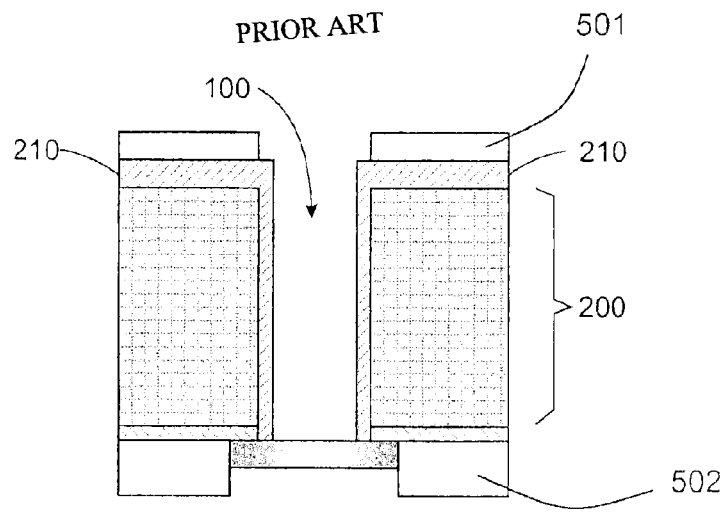
FIGS. 1a to 1c illustrate the prior art and the main steps of the forming of a TSV by electrochemical deposition. The elements 501 and 502 respectively symbolise the technology of the rear and front faces around the TSV.
Figure 1B:
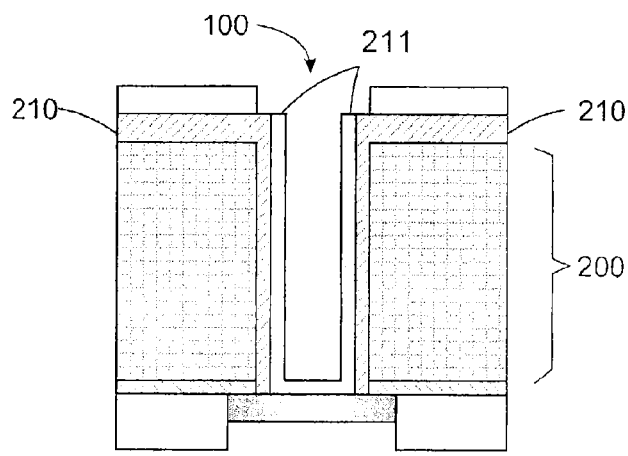
Figure 1C:
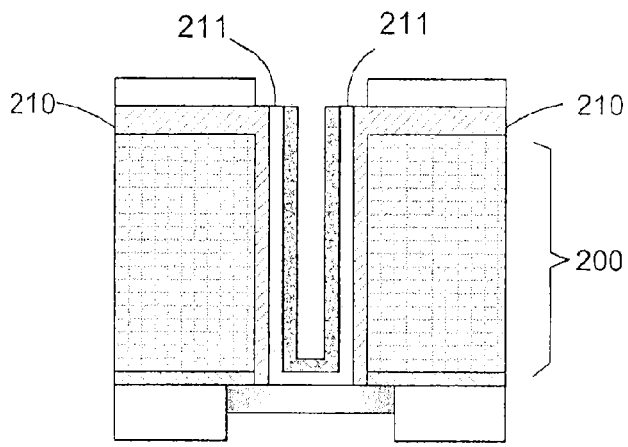

A continuous bottom no longer needs to be deposited into the holes 100 of the substrate where the vias are formed, as it used to be in the prior art illustrated in FIGS. 1a to 1c. In the traditional technique, the continuous bottom is indispensable for the electrochemical deposition to be made. In addition, the difficulty inherent in the continuity of a barrier preventing the diffusion of the metal of the TSV into the material of the substrate, for instance silicon, is thus eliminated.

The dielectric layer 210 may be of a lower quality (thickness, intrinsic properties) since the pillar is not in contact with the edges of the silicon substrate 200, except for the places where the areas 402 made of the malleable material of the composite pillar are crushed, as shown more particularly in FIG. 6a. In one embodiment, the pillar 300 is, prior to bond, coated with an electric insulating layer by means of any suitable technique such as PVD and PECVD. The insulating layer thus formed at the base of the pillar 300, where the pillar 300 will be inserted into the hole, is simply removed, for instance by CMP polishing.

The areas 402 are advantageously positioned far enough from the bottom of the hole 100 to avoid being in contact with an incomplete dielectric layer. In the example of a 200 μm deep hole, the opening of which is provided with a 3 μm thick insulating layer 210 and a null thickness in the worst case at the bottom of the via, and comparing the profile of the deposit of the insulating layer to a triangle, the distance from the member 402 the furthest in the hole to the bottom of the hole amounts to 30 μm to be in contact with a 500 nm thick SiO2 insulating layer, selected as a thickness ensuring a correct insulation. This distance h is given by $$h = \frac{thickness\,of\,the\,insulating\,layer\,210\,at\,the\,bottom}{thickness\,of\,the\,insulating\,layer\,210\,at\,the\,top} \cdot depth\,of\,the\,hole\,100$$

(Thales' Theorem)

Above, the dielectric is thick enough to provide a good insulation. Besides, if the substrate has been over-etched at the bottom of the hole, as shown in FIG. 5, the insulating layer 210 is totally absent there. As already noted, this is advantageously compensated by the method of the invention wherein an air space is left around the pillar 300 and provides insulation alone, in these critical places.

In order to enhance the performances of the diffusion barrier, high deposition temperatures above 300° C. are used, for most of the materials liable to be suitable (TiN, Ru, TaN . . . ), and such temperatures cannot always be withstood by the circuits and the components of the substrate. High temperatures enable the material to be deposited in amorphous state. As such it is a better barrier against diffusion. The invention makes it possible to do without a barrier, and thus the problems related to high temperatures are eliminated.

It should also be noted that filling can advantageously be executed with a reduced volume, the duration of electrolysis and thus the cost being also reduced. The production of the via is thus accelerated. Besides, the substrates may be lighter, while keeping good mechanical properties.

The compression or thermo-compression of the contact area 401, if so required, makes it possible to planarize the substrate supporting the pillar(s). Defective uniformity of an electrochemical deposition always amounts to a few percent for the considered dimensions (generally less than 5%), which might create difficulties when mounting the pillars on the substrate. Such defective uniformity is thus advantageously compensated by the method of the invention.

As for the devices which must be operated at high temperatures, the air space gives clearance to the pillar; problems of expansion constraints are thus avoided. Adding the members 402 and/or 401 made of a (malleable) material melting at a low temperature and/or having an elastic limit lower than that of the pillar 300 shaft also makes it possible to limit the expansion in the plane perpendicular to the substrate 200 (according to the height of the pillar 300), so as not to develop delamination on the front and rear faces of the substrate, when the assembled component(s) has(ve) to operate at a high temperature, either to complete the manufacturing process, or when operating.

As a matter of fact, thanks to its mechanical properties, the member 402 and/or the member 401 can plastically deform due to the stress caused by the expansion of the intermediary areas formed by the shaft parts 305.

The alloy of tin, silver and copper (SnAgCu) mentioned above expands more than copper at temperatures ranging from 20° C. to 250° C. The coefficients of expansion have respectively the following values: 22×10−6 and 17×10−6 between 20° C. and 100° C. A pillar associating a deposition of copper and a deposition of the above alloy is thus advantageous to compensate the expansion by a plastic deformation and limit the stress on the substrate during operation at a high temperature, which results in a significant gain in reliability and mechanical behaviour of a device using the method of the invention.

Another embodiment of the method of the invention is illustrated in FIGS. 10 to 15. In this alternative embodiment, a bond from the second substrate 200' is not required.

Figure 10:
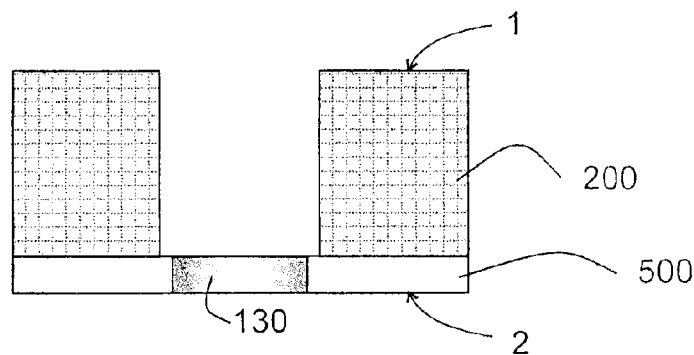
FIGS. 10 to 13 illustrate the successive step of a possible alternative embodiment of the invention wherein the pillar is not the result of a bond.
Figure 11:
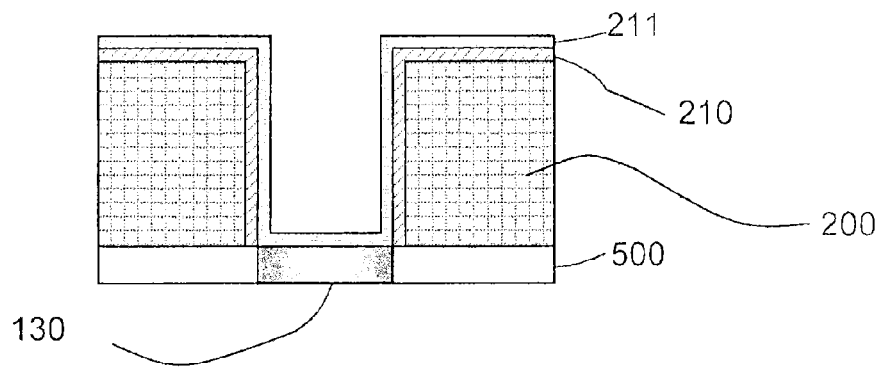

The method, in this example, starts as shown in FIG. 10 with a deep etching of the substrate 200 wherein an aperture having a desired and variable dimension of, for example, 200 μm in depth and 75 μm in diameter. Similarly to the bond method, a dielectric layer 210 is deposited inside the cavity of the hole 100 and on the face 1 of the substrate 200, with the opposite face 2 being the face comprising the connection at the bottom of the via 130 and the technology summarized under element 500. The element 130 must be electrically insulated from the substrate 200. Dry etching of the layer 210 is executed to have the conducting element 130 be flush with the bottom of the via. Unlike the case with pillar bond, a continuous metallic bottom 211 is deposited onto the element 210. Such continuous bottom 211 may conventionally be made of a primer (for instance made of titanium) and a conducting layer (for example made of copper) on the primer. The copper layer will be used for bringing current to the bottom of the cavity, during a subsequent step of filling. The result of forming insulating layers 210 and the continuous bottom 211 is shown in FIG. 11.

Figure 12:
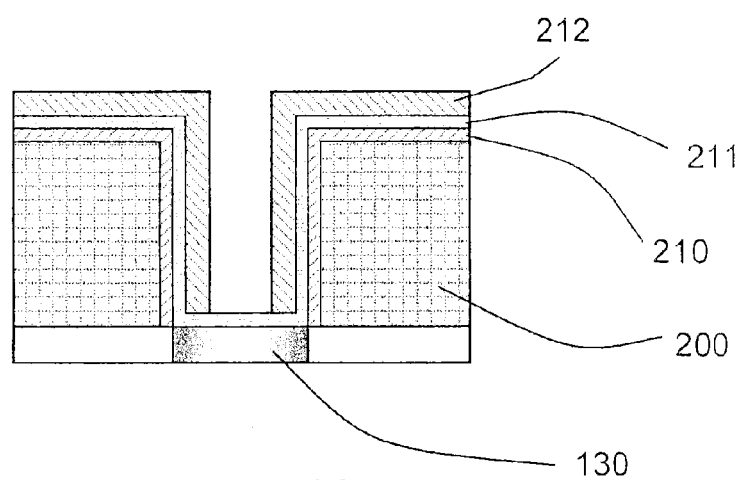
Figure 13:
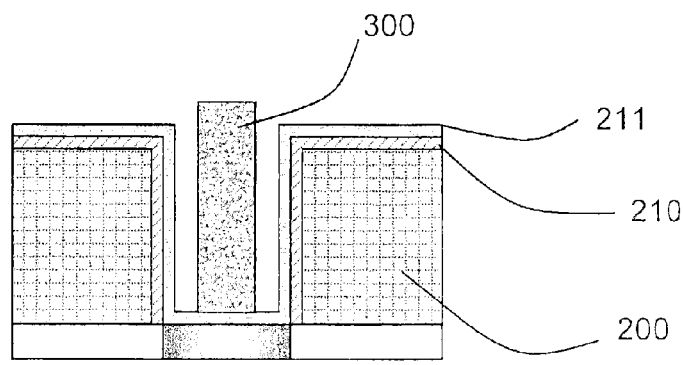

A thick resist is then spread on the rear face until the via(s) provided on such face is/are filled. Lithography is executed to form a pattern in the resist layer 212 by providing an aperture preferably centered on the via and having a smaller diameter as shown in FIG. 12.

The cavity defined by the pattern is then advantageously filled with an electrochemical deposit. The technology used may be similar to the electrolysis considered for the embodiment comprising a bond. The surface not covered by the resist 212 of the area 130 will advantageously be prepared prior to the electrochemical deposition. If the continuous bottom is made of copper, among other materials, the surface will be deoxidized with sulphuric acid, for instance Resist wettability may be improved with plasma processing. One or more material(s) can be deposited. Resist is at least partially chemically removed, for instance, so as to leave only the deposit grown by electro-chemistry. Thus a conducting pillar 300 is provided, which connects the front and the rear faces of the component and which is isolated from the wall of the cavity by an air space, at this stage of the method illustrated by FIG. 13. Then the etching of the continuous bottom can be executed, as in the state of the art.

Figure 14:
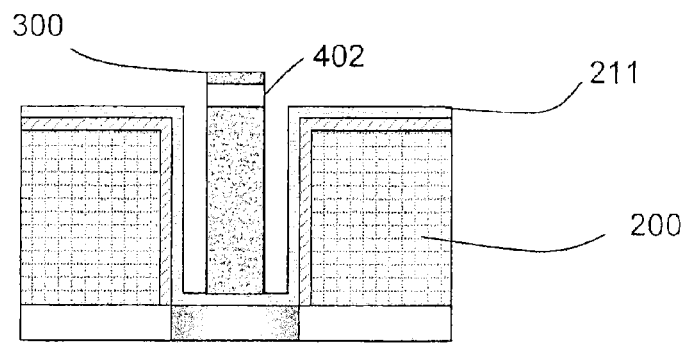
FIG. 14 illustrates an alternative embodiment of FIG. 13 with a composite pillar.

A deposit of a material melting at a low temperature and/or more easily malleable than other parts of the pillar 300 can advantageously be integrated in the electrochemical deposition to provide at least one holding member 402 as shown in FIG. 14. Such malleable material will have a lower elastic limit than the material which the pillar 300 shaft is made of, and advantageously a significant elongation capacity, of the order of several dozens percent. Of a force has just been applied to the top of the pillar, as seen above, the member 402 will plastically deform until it reaches the wall 101 of the hole 100, since it has a lower elastic limit than the metallic element the pillar 300 shaft is made of. Copper, for instance, may be selected for the pillar 300 shaft and a tin alloy such as SAC, also based on copper and silver, may be selected for the member. Such pressure may be applied on several vias at the same time, even on the wafer, if ever the aim is to have bonded pillars of the same size.

A structure can thus be obtained for the pillar 300 which is in contact with the face 2 through the element 130 and which is supported by the walls of the cavity of the hole 100 thanks to the holding member 402 in the configuration shown in FIG. 15. Besides, such structure facilitates the electric connection with a rear face technology.

This embodiment of the invention provides several advantages. Similarly to the bond method, the air space around the pillar 300 in the cavity enhances the pillar insulation. The space 105 of the cavity may be filled with a malleable material so as to insulate the cavity from the atmosphere and provides additional mechanical support to the pillar in the cavity. Holding can be provided at the top of the cavity, where the thickness of the dielectric is significant, of the order of 3 µm, for a deposit of 4 µm of SiON on the surface of face 1 for example. The metal(s) composing the pillar will not diffuse to the substrate 200.

The method ensures a good electric contact of the pillar 300 with the substrate 200 at the bottom of the via, with the growing starting from said substrate 200. Lithographic technologies are used, which facilitate centering.

A continuous bottom 211 is deposited, unlike in the pillar bond, but the pillar is not separated by the etching of a second substrate. When depositing Titanium-Copper, the step of etching does not damage the copper or composite pillar with a tin-based alloy, such as SAC, the thickness of the deposited continuous bottom layers are much smaller, of the order of a hundred nanometers ($10^{-9}$ m) as compared to a thickness of several microns for the pillar 300.

Applying pressure is not compulsory to create an intimate contact between the electric contact 130 and the pillar.

Like the method for bonding the pillar, such method makes it possible not to use a deposit of materials to form a barrier to the diffusion of the pillar species toward the side walls of the substrate 200. As the diffusion barriers are mainly deposited at a high temperature (>300° C.) to favour the amorphous characteristic of the layers, the substrate is not heated.

Like the method for bonding the pillar, the pillar grows in one direction in the resist, from the bottom of the via; the forming of holes in the deposit resulting from a simultaneous growth from the side wall of the via is thus avoided.

The filling of the hole cavity by a holding member 402, by crushing a malleable material can be executed wafer per wafer or locally.

In all these alternative embodiments, the method of the invention (with or without bond) can be implemented to provide connections with at least one pillar 300 wherein the space 105 is at least partially filled with a dielectric material such as an insulating resist or wherein the pillar is intended to come in contact with an advantageously electrically insulating layer of the component. Additionally, the electrically conducting element may comprise other components than the pillar through the thickness of the substrate.

The method of the invention and the structure of vias of the TSV type obtained may also be advantageously used for applications such as the production of probe-cards for the electric testing of the chips, prior to the cutting off thereof from the wafer whereon they have been made. The probe-cards are so designed as to come into contact, on a test machine, with all the input and output points of each chip of a wafer, generally on the solder lands which will be used for the connections with the box, so that the circuits can be tested in situ, without having to be mounted on a box. Then the chips found faulty will not be mounted on the wafer.

Figure 7:
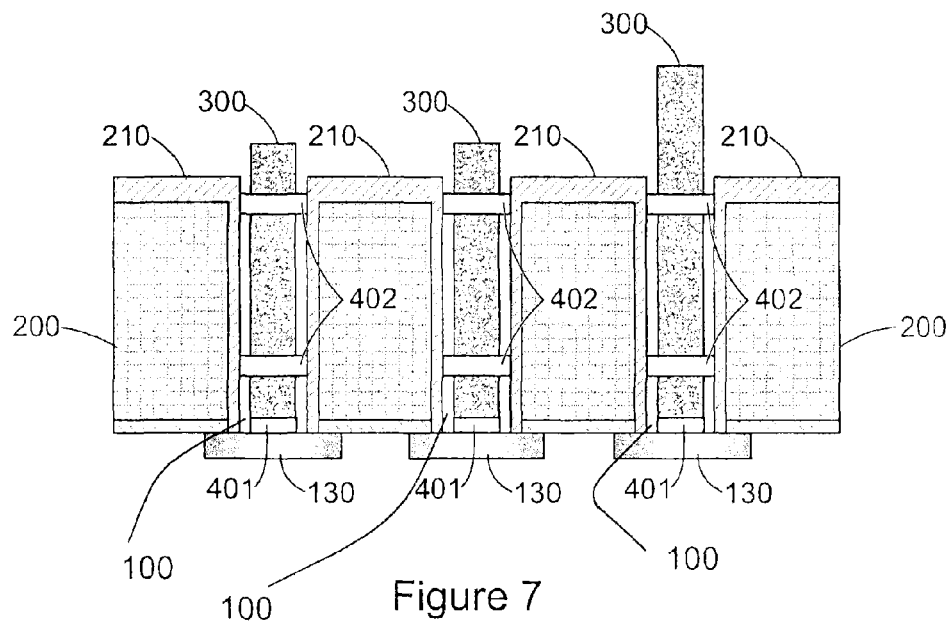
FIG. 7 shows a component with several electric connections through the thickness thereof in an exemplary application of the invention to the production of probe-cards intended for testing chips on wafers prior to cut-off.

As shown in FIGS. 3a to 3c, once released, the pillar 300 may be a test probe, the height of which can be chosen by adjusting the height of the layer of resist used for delimiting the areas where the electrochemical deposition must be executed. Probes, with a very small spacing of the order of a few dozens of microns, and having variable height, typically varying up to 50 µm, can thus be executed on the same substrate 200, as shown in FIG. 7. This is obtained with a successive bond of pillars having different heights in holes 100 having the same depth. Holes 100 unfilled during the first bond may receive other pillars 300 during a second bond. The pillars having different lengths are prepared on different bond substrates. There are as many bond substrates as probes having different lengths to be provided.

Figure 8:
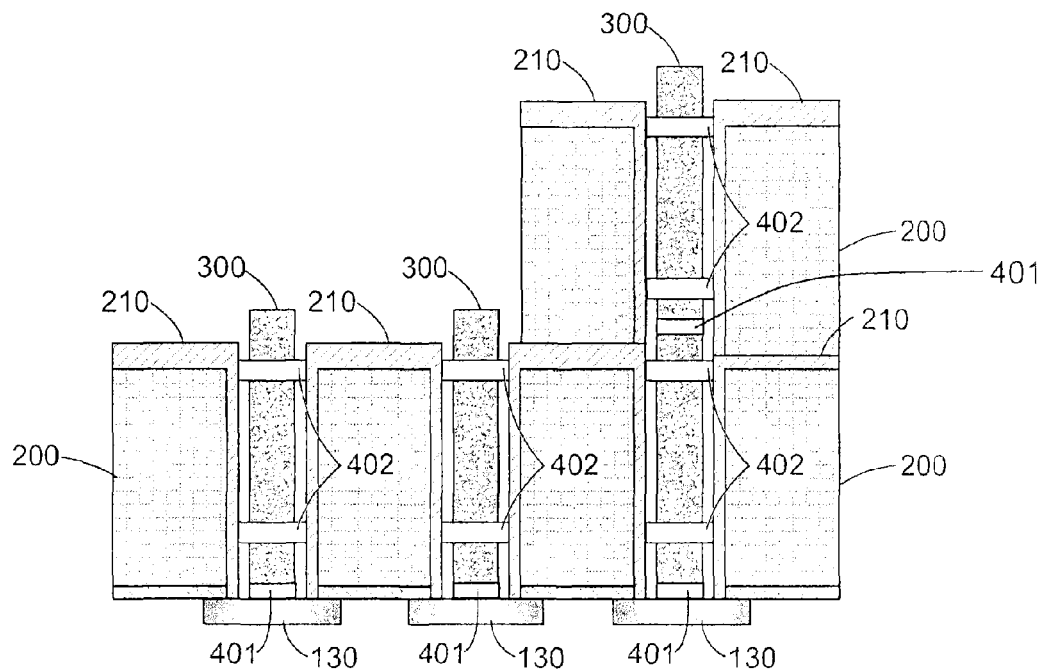
FIG. 8 shows another example of the invention to form an electronic assembly as a stack for producing probe-cards able to test chips on wafers, the solder lands of which are widely spaced in height.

Eventually, in order to simultaneously test a device comprising solder lands with very significant differences in altitude, typically above 50 µm, a system as shown in FIG. 8 can be obtained by assembling components by stacking, with the same idea in mind, i.e. welding with the fusible alloy having a very small height (<2 µm) so that it can no longer be deformed, or as little deformed as possible after the first compression. Thermo-compression may, in this case as well as in the other ones, result in the forming of intermetallic materials between the members 402 and/or 401 and the rest of the pillar 300, having a melting temperature higher than that of the material(s) of the members 402 and/or 401 thus ensuring a better stability of the assembly.

More particularly, FIG. 8 shows the presence, on the right, of two superimposed substrates 200 spaced by an insulating layer 210. Each conducting pillar 300 protrudes beyond the insulating layer 210. Both conducting pillars 300 which are superimposed are thus vertically aligned and joined by the contact zone 401 of the upper conducting pillar 300, which is no longer compressed on the connection area 130 but on an upper surface of the conducting pillar 300 which remains above the lower structure.

The present invention thus makes it possible to easily superimpose components and thus several substrates housing conducting pillars which are inserted prior to superimposing the substrates proper.

FIG. 9 more specifically shows a probe-card made from a substrate 200 beyond the first face 1 from which the probes of the distal end of the pillars 300 protrude. CMOS type technologies may be embedded on face 1 as well as on face 2. The Figure also shows the wires 4 connecting the component thus formed on a support 3.

The invention claimed is:

1. An electronic component comprising:
    a substrate having a hole at least partially going through a thickness of the substrate to form an inner sidewall of the hole;
    an electrically conducting element positioned in the hole and configured to form an electric connection through the hole, wherein the electrically conducting element comprises an electrically conducting and self-supporting pillar having a peripheral wall with a height corresponding to a thickness of the substrate;
    a holding member provided in said hole and connecting said peripheral wall of the pillar to said inner sidewall of the hole; and
    a space that is under vacuum or at least partially filled with a dielectric gas between at least a part of the inner sidewall of the hole and a part of a peripheral wall of the pillar.

2. A component according to claim 1, wherein the pillar comprises said holding member.

3. A component according to claim 2, wherein the holding member is a segment forming a part of a height of the pillar.

4. A component according to claim 3, wherein the holding member is superimposed on a shaft part of the pillar, and wherein a material of the holding member is different from a material of the shaft part and has an elastic limit lower than that of the material of the shaft part.

5. A component according to claim 2, wherein the holding member is configured to close the space to make the space airtight.

6. A component according to claim 2, wherein the holding member is located at a first end of the hole.

7. A component according to claim 2, further comprising at least another holding member spaced from the holding member according to a height of the pillar.

8. A component according to claim 1, further comprising an electric connection area at a second end of the hole, wherein:
    the pillar comprises a conducting member in contact with the electric connection area and with a shaft part of the pillar, and
    a material of the conducting member is different from a material of the shaft part and has an elastic limit lower than that of the material of the shaft part.

9. A component according to claim 1, wherein the space is closed.

10. A component according to claim 1, wherein the inner sidewall of the hole is at least partially formed by a surface of an insulating layer.

11. A component according to claim 1, wherein the substrate is at least partially made of a semiconducting material.

12. A component according to claim 1, comprising plural holes and plural pillars, two of which at least have a different height.

13. A method for creating an electric connection through at least a part of a thickness of a substrate of an electronic component, comprising:
    forming a hole at least partially going through the thickness of the substrate to form an inner sidewall of the hole; and
    forming an electrically conducting element positioned in the hole and configured to form an electric connection through the hole, wherein forming the electrically conducting element comprises:
        forming an electrically conducting and self-supporting pillar having a peripheral wall with a height corresponding to a thickness of the substrate,
        providing a holding member in said hole and connecting said peripheral wall of the pillar to said inner sidewall of the hole, and
        forming a space that is under vacuum or at least partially filled with a dielectric gas between at least a part of the inner sidewall of the hole and a part of the peripheral wall of the pillar.

14. A method according to claim 13, wherein the forming the pillar comprises forming, in the pillar, said holding member.

15. A method according to claim 14, wherein contacting the holding member with the inner sidewall of the hole is obtained by plastic deformation of the holding member.

16. A method according to claim 15, wherein the plastic deformation of the holding member is executed by compression or thermo-compression of the pillar present in the hole.

17. A method according to claim 14, wherein the forming the holding member comprises a deposition, on one shaft part of the pillar, of a layer of a material composing the holding member, with the material being selected so that an elastic limit thereof is lower than that of a material of the shaft part.

18. A method according to claim 14, wherein contacting the holding member with the inner sidewall of the hole is configured to close the space to make the space airtight.

19. A method according to claim 14, wherein the holding member is located at a first end of the hole.

20. A method according to claim 14, wherein the forming the pillar comprises forming at least another holding member spaced from the holding member according to a height of the pillar.

21. A method according to claim 15, wherein a material of the holding member is an alloy, and
    the method further comprising transformation of the alloy into an intermetallic material after the holding member has come into contact with the inner sidewall of the hole.

22. A method according to claim 14, wherein the forming the pillar comprises production of a conducting member on a base of a shaft part of the pillar, with a material of the conducting member having an elastic limit lower than that of a material of the shaft part, and
    the method further comprising plastic deformation of the conducting member by compression or thermo-compression of the shaft, in contact with the electrically conducting supporting member.

23. A method according to claim 22, comprising use, as the supporting element, of an electric connection area formed at a second end of the hole.

24. A method according to claim 17, wherein the producing the pillar comprises forming a pillar shaft having a diameter smaller than a diameter of the hole and forming the holding member having a diameter smaller than the diameter of the hole; and
   wherein contacting the holding member with the inner sidewall of the hole comprises compression or thermo-compression of the holding member to increase a section thereof until it contacts the inner sidewall of the hole.

25. A method according to claim 13, wherein the forming the pillar comprises:
   producing the pillar from a second substrate different from the substrate,
   inserting the pillar into the hole.

26. A method according to claim 14, wherein the forming the pillar comprises:
   producing the pillar from a second substrate different from the substrate,
   inserting the pillar into the hole; and
   wherein the producing the pillar comprises forming a pillar shaft having a diameter smaller than a diameter of the hole and forming the holding member having a diameter greater than the diameter of the hole; and
   wherein contacting the holding member with the inner sidewall of the hole comprises plastic deformation of a peripheral part of the holding member when in contact with a part of the inner sidewall of the hole during the inserting.

27. A method according to claim 26, wherein a material composing the holding member is selected to have an elastic limit lower than that of a material of the part of the surface of the hole.

28. A method according to claim 25, wherein the second substrate is removed after the inserting to leave the pillar only in the substrate.

29. A method according to claim 13, wherein the forming the pillar comprises:
   filling the hole with resist;
   performing lithography in the resist to form a pillar pattern;
   depositing, into the pattern, at least one layer of the material composing the pillar;
   at least partially removing resist.

30. A method according to claim 29, further comprising, prior to the filling, depositing an electrically conducting continuous bottom layer into the hole, and wherein the depositing is executed by electrochemical deposition.

* * * * *